(12) United States Patent
Gu et al.

(10) Patent No.: US 11,152,592 B2
(45) Date of Patent: Oct. 19, 2021

(54) DISPLAY AREA DRILLING AND PACKAGING STRUCTURE AND METHOD, DISPLAY DEVICE

(71) Applicant: BOE TECHNOLOGY GROUP CO., LTD., Beijing (CN)

(72) Inventors: Penghao Gu, Beijing (CN); Chunyan Xie, Beijing (CN); Lingzhi Qian, Beijing (CN); Jiahao Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 164 days.

(21) Appl. No.: 16/422,496

(22) Filed: May 24, 2019

(65) Prior Publication Data

US 2020/0052244 A1    Feb. 13, 2020

(30) Foreign Application Priority Data

Aug. 13, 2018   (CN) .......................... 201810917621.4

(51) Int. Cl.
| | | |
|---|---|---|
| *H01L 51/52* | (2006.01) | |
| *H01L 51/56* | (2006.01) | |
| *F21Y 105/00* | (2016.01) | |
| *H01L 27/32* | (2006.01) | |

(52) U.S. Cl.
CPC ...... *H01L 51/5253* (2013.01); *H01L 51/5209* (2013.01); *H01L 51/56* (2013.01); *F21Y 2105/00* (2013.01); *H01L 27/3246* (2013.01); *H01L 2251/5338* (2013.01); *H01L 2251/5369* (2013.01)

(58) Field of Classification Search
CPC . H01L 51/5253; H01L 51/5209; H01L 51/56; H01L 27/3246; H01L 2251/5338; H01L 2251/5369; F21Y 2105/00
USPC .......................................................... 257/100
See application file for complete search history.

(56) References Cited

U.S. PATENT DOCUMENTS

| | | | |
|---|---|---|---|
| 10,615,369 B2 * | 4/2020 | Choi | ................... H01L 51/0097 |
| 2019/0051859 A1 * | 2/2019 | Choi | ................... H01L 51/0097 |

FOREIGN PATENT DOCUMENTS

| | | |
|---|---|---|
| CN | 104638201 | 5/2015 |
| CN | 105733473 | 7/2016 |
| CN | 107968157 | 4/2018 |
| CN | 108172696 | 6/2018 |
| EP | 2368862 | 9/2011 |
| JP | 2009099417 | 5/2009 |

OTHER PUBLICATIONS

First Office Action dated Jan. 2, 2020 for Chinese Patent Application No. 201810917621.4.

\* cited by examiner

*Primary Examiner* — Tu-Tu V Ho
(74) *Attorney, Agent, or Firm* — Thomas | Horstemeyer, LLP

(57) ABSTRACT

A display area drilling and packaging structure includes a back plate assembly, an emitting layer having a drilling area, and a hot melted adhesive layer. The emitting layer is disposed on the back plate assembly, and an annular cutting groove surrounding the drilling is disposed on the emitting layer. The hot melted adhesive layer at least covers an edge of a mouth of the annular cutting groove away from a center. A packaging layer is disposed on the back plate assembly, the hot melted adhesive layer, and the emitting layer.

20 Claims, 5 Drawing Sheets

DISPLAY AREA DRILLING AND PACKAGING STRUCTURE AND METHOD, DISPLAY DEVICE

CROSS REFERENCE TO RELATED APPLICATION

This application is based upon, and claims the benefit of and priority to, Chinese Patent Application No. 201810917621.4, filed on Aug. 13, 2018, the entire contents thereof are incorporated herein by reference.

TECHNICAL FIELD

The present disclosure relates to the technical field of display devices, and, in particular, to a display area drilling and packaging structure, a display area drilling and packaging method, and a display device.

BACKGROUND

Organic Light Emitting Display (OLED) devices have gradually become the first choice for display screens. OLED devices have many advantages, such as being capable of self-illumination, having high luminous efficiency, having a short response time, high clarity, and contrast, and also ensuring that the screen has a certain flexibility and adaptability. With an increasing demand for large screens, a full screen with narrow borders has become the mainstream in the current design. The necessary front functional components, such as camera(s) and sensor(s), can be accommodated in the screen using a special-shaped cutting fringe design, which requires drilling in the illuminating area of the screen to have the camera and the sensor and the like accommodated therein, which undoubtedly has a stronger visual impact of the "full screen." Additionally, for an electronic device, such as a timepiece, the electronic device is required to have components, such as an axis, built in the center of the electronic. Thus, drilling in the display area undoubtedly becomes the mainstream design for the next-generation "full screen."

The contents disclosed in the Background portion are merely used to reinforce an understanding of the background technology of the present disclosure. Accordingly, the Background portion may include information that does not constitute related art as already known by an ordinary person skilled in the art.

SUMMARY

The present disclosure provides a display area drilling and packaging structure, which includes:
a back plate assembly;
an emitting layer, which is disposed on the back plate assembly and has a drilling area, an annular cutting groove being disposed on the emitting layer, and the annular cutting groove surrounding the drilling area;
a hot melted adhesive layer, which at least covers an edge of a mouth of the annular cutting groove away from a center; and
a packaging layer, which is disposed on the back plate assembly, the hot melted adhesive layer, and the emitting layer.

According to one exemplary implementation of the present disclosure, the hot melted adhesive layer includes a resin and inorganic nanoparticles that are added into the resin and have a density greater than the resin.

According to one exemplary implementation of the present disclosure, the resin is an EVA resin, and the inorganic particles are $SiO_2$ nanoparticles.

According to one exemplary implementation of the present disclosure, the packaging layer includes:
a first inorganic layer disposed on the back plate assembly, the hot melted adhesive layer, and the emitting layer, wherein a receiving groove is formed on the first inorganic layer covering a groove wall of the annular cutting groove.

According to one exemplary implementation of the present disclosure, the packaging layer further includes an organic packaging layer disposed on the first inorganic layer and forms interruptions on the hot melted adhesive layer and on a region surrounded by the hot melted adhesive layer.

According to one exemplary implementation of the present disclosure, the packaging layer further includes a second inorganic layer disposed on the organic packaging layer and the first inorganic layer, wherein a cutting space is formed on the second inorganic layer covering the groove wall of the receiving groove.

According to one exemplary implementation of the present disclosure, the back plate assembly includes:
a flexible substrate;
an intermediate layer disposed on the flexible substrate; and
a flat layer disposed on the intermediate layer in which the flat layer is provided with a via hole at a position facing the drilling area, and an area of the via hole is larger than an area of the drilling area.

According to one exemplary implementation of the present disclosure, the back plate assembly further includes an inorganic layer disposed in the via hole.

According to one exemplary implementation of the present disclosure, the back plate assembly further includes an anode layer disposed on the flat layer in which the anode layer is provided with a first through hole, and an area of the first through hole is larger than an area of the drilling area.

According to one exemplary implementation of the present disclosure, the back plate assembly further includes a pixel definition layer disposed on the anode layer in which the pixel definition layer is provided with a second through hole, and an area of the second through hole is larger than the area of the drilling area.

The present disclosure further provides a display area drilling and packaging method, including:
forming a back plate assembly;
forming an emitting layer on the back plate assembly, the emitting layer having a drilling area and an annular cutting area surrounding the drilling area;
forming a hot melted adhesive layer on the emitting layer, the hot melted adhesive layer covering the annular cutting area, a width of the hot melted adhesive layer being greater than a width of the annular cutting area;
cutting the hot melted adhesive layer and the emitting layer along the annular cutting area to form an annular cutting groove in which the hot melted adhesive layer melts at least covers the edge of the mouth of the annular cutting groove away from the center;
forming a packaging layer on the back plate assembly, the hot melted adhesive layer, and the emitting layer.

According to one exemplary implementation of the present disclosure, the hot melted adhesive layer comprises a resin and inorganic nanoparticles that are added into the resin and have a density greater than the resin.

According to one exemplary implementation of the present disclosure, the resin is an EVA resin, and the inorganic particles are $SiO_2$ nanoparticles.

According to one exemplary implementation of the present disclosure, the hot melted adhesive layer is provided in a ring shape, and has an outer edge protruded to an outer edge of the annular cutting area.

According to one exemplary implementation of the present disclosure, an inner edge of the hot melted adhesive layer is equal to or smaller than an inner edge of the annular cutting area.

According to one exemplary implementation of the present disclosure, the hot melted adhesive layer is configured in a square sheet shape, and has an outer edge protruded to an outer edge of the annular cutting area.

The present disclosure further provides a display device that includes the display area drilling and packaging structure according to present disclosure.

BRIEF DESCRIPTION OF THE DRAWINGS

The foregoing and other features and advantages of this disclosure will become more apparent from the following detailed description of this disclosure when taken in conjunction with the accompanying drawings.

DETAILED DESCRIPTION

Figure 1:
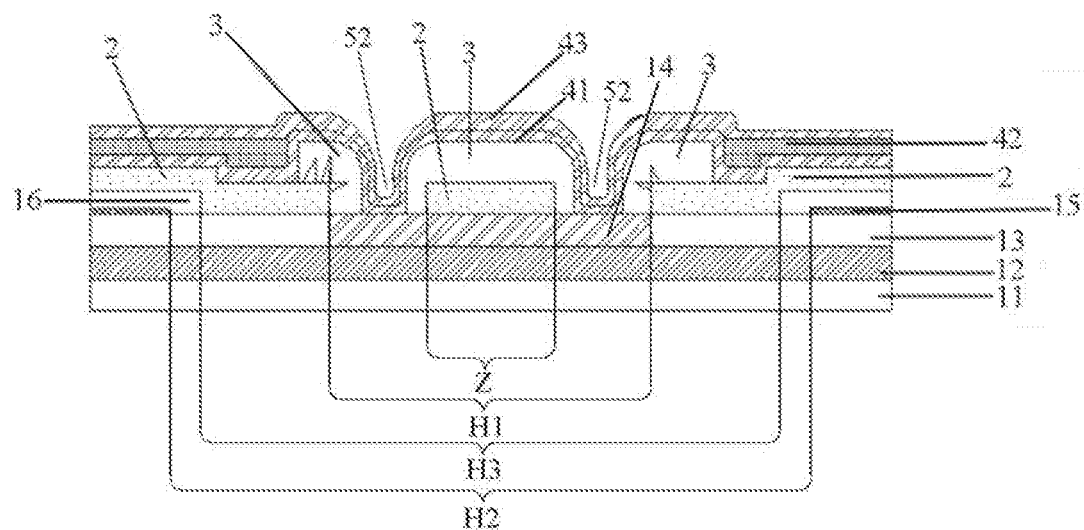
FIG. 1 is a schematic structural view of one implementation of a display area drilling and packaging structure of the present disclosure.

Now, example implementations will be described more completely with reference to the accompanying drawings. However, the exemplary implementations can be done in various forms and should not be construed as limiting the implementations as set forth herein. Instead, these implementations are provided so that this disclosure will be thorough and complete, and the concepts of the exemplary implementation will be fully conveyed to those skilled in the art. Same reference numbers denote the same or similar structures in the drawings, and thus the detailed description thereof will be omitted.

A laser drilling technology has been wildly used in the semiconductor manufacturing. With the development of laser equipment having high precision, such as picoseconds and femtoseconds and low thermal impact, laser drilling may achieve higher precision and small thermal impact. The $CO_2$ infrared laser has been widely used in cutting of flexible display devices. The $CO_2$ infrared laser may be used to cut an emitting layer to form an annular cutting groove, and the remaining parts of the display are then cut off along the annular cutting groove by the picosecond laser, such that a hollow region is formed. Package protection for the organic material of the emitting layer must be considered, such that an improved package is required to annularly cut the edges of the groove after cutting off the emitting layer to prevent water vapor and oxygen from entering from the drilling area Z and diffusing to malfunction the device.

As such, it is necessary to provide a display area drilling and packaging structure, a display area drilling and packaging method, and a display device.

An object of the present disclosure is to overcome shortcomings in the display device of the related art, i.e., where water vapor and oxygen easily entering from a drilling area Z into and diffusing in the display device. A display area drilling and packaging structure and a display area drilling and packaging method are provided, as well as a display device in which the water vapor and the oxygen do not easily enter from the drilling area Z.

The present disclosure provides a display area drilling and packaging structure. The display area drilling and packaging structure may include a back plate assembly, an emitting layer 2, a hot melted adhesive layer 3, and a packaging layer. The emitting layer 2 is disposed on the back plate assembly, and an annular cutting groove is disposed on the emitting layer 2. The hot melted adhesive layer 3 covers at least an edge of a mouth of the annular cutting groove far away from a center. The packaging layer is disposed on the back plate assembly, the hot melted adhesive layer 3, and the emitting layer 2.

Referring to FIG. 1, a schematic structural view of one implementation of the display area drilling and packaging structure is shown.

In this exemplary implementation, the back plate assembly may include a flexible substrate 11. The flexible substrate 11 may be made from polyimide. An intermediate layer 12 is disposed on the flexible substrate 11. The intermediate layer 12 may include a buffer layer, a barrier layer, a gate layer, a metal electrode layer, an isolation layer, and the like. A flat layer 13 is disposed on the intermediate layer 12. The flat layer 13 may be a polyimide (PI) adhesive that is heat-resistant and has poor water-oxygen isolation capacity. A via hole H1 is formed in the drilling area Z of the flat layer 13 where hole(s) are needed to be drilled. The via hole H1 is formed by a way of a photolithography, and the area of the via hole H1 is larger than the area of the drilling area Z, so that the flat hole cannot be touched as drilling to avoid the polyimide adhesive from being heated to melt during the drilling.

Figure 2:
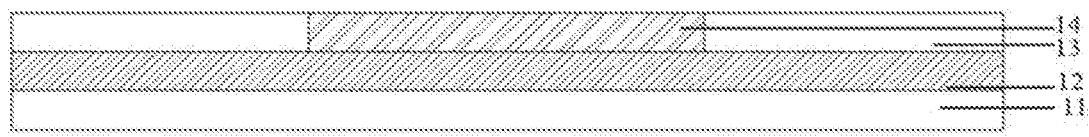
FIG. 2 is a schematic structural view of the back plate assembly of FIG. 1.

Referring to the schematic structural view of the back plate assembly as shown in FIG. 2, an organic layer 14, which is made from SiNx, is disposed in the via hole H1. Since the area of the via hole H1 is larger than the area of the drilling area Z, the area of the inorganic layer 14 is also larger than the area of the drilling area Z so that a part of the organic layer 14 remains after drilling.

In this exemplary implementation, the back plate assembly may further comprise an anode layer 15 and a pixel definition layer 16. An anode layer 15 is disposed on the flat layer 13, and a first through hole H2 is disposed on the anode layer 15. The area of the first through hole H2 is larger than the area of the drilling area Z, so that the anode layer 15 cannot be touched during drilling to avoid the anode layer 15 being affected by heat during the process of drilling so that the anode metal droplets generate burrs.

The pixel definition layer 16 is disposed on the anode layer 15, and a second through hole H3 is provided on the pixel definition layer 16. The area of the second through hole H3 is also greater than the area of the drilling area Z, so that the pixel definition layer 16 cannot be touched during drilling. The area of the second through hole H3 is smaller than the area of the first through hole H2, so that the pixel definition layer 16 wraps the edge of the anode layer 15.

In this exemplary implementation, an emitting layer 2 is formed on the pixel definition layer 16, the flat layer 13, and the inorganic layer 14. The emitting layer 2 includes a light emitting material, a cathode, and laser induced fluorescence (referred to as LiF) layer, and so forth.

Figure 3:
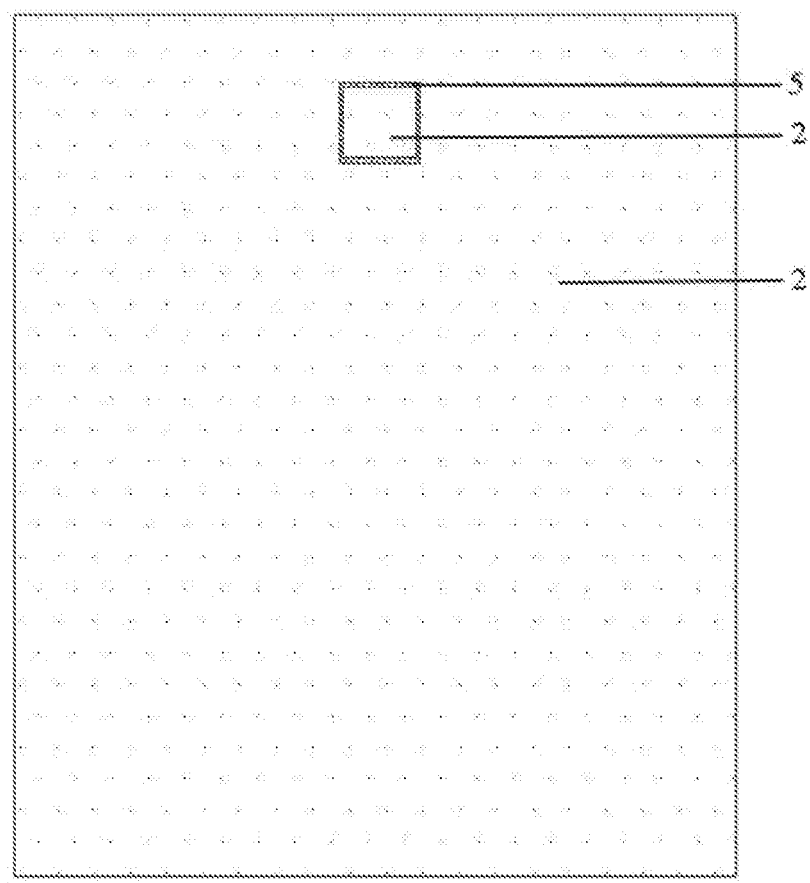
FIG. 3 is a schematic structural view of an annular cutting groove which is required to be formed in the display area.

Referring to the schematic structural view of an annular cutting groove which is required to be formed in the display area as shown in FIG. 3. An annular cutting groove is formed on the emitting layer 2. The area enclosed by the annular cutting groove is a drilling area Z which is required to be drilled. The annular cutting groove is formed by laser cutting, so that the shape of the laser cutting area 5 is substantially the same as that of the annular cutting groove. In this exemplary implementation, the shape of the drilling area Z is square, accordingly, the shape of the annular cutting groove is square, that is, the cross section of the annular cutting groove is a square frame. Of course, the drilling area Z may also be round, rectangular, trapezoidal, and other shaped according to the actual assembling requirements.

Figure 4:
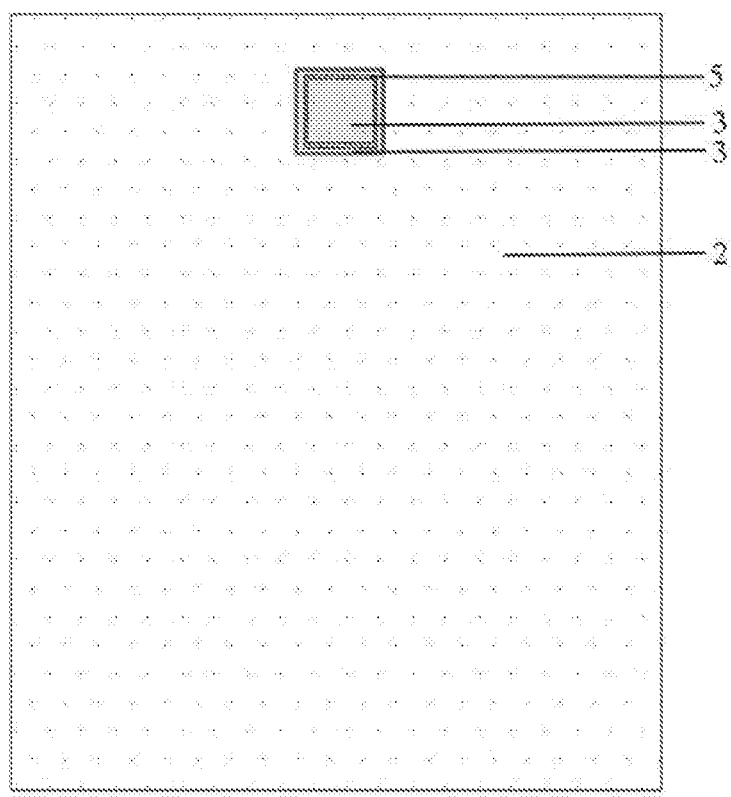
FIG. 4 is a schematic structural view of one implementation of a hot melted adhesive layer formed in the display area in FIG. 3.

Referring to FIG. 4, a schematic structural view of one implementation of a hot melted adhesive layer formed in the display area in FIG. 3 is shown. The hot melted adhesive layer 3 is square and covers the emitting layer 2. An outer edge of the hot melted adhesive layer 3 protrudes from the outer edge of the laser cutting area 5, that is, the hot melted adhesive layer 3 covers not only the portion where the annular cutting groove intends to be formed, but also the region surrounded by the annular cutting groove and the peripheral portion of the annular cutting groove. The arranged hot melted adhesive layer 3 is melted by the laser cutting to not only cover the emitting layer 2 of the drilling area Z, but also cover the edges on the both sides of the mouth of the annular cutting groove. Sufficient hot melt adhesive flows into the annular cutting groove and extends to cover the groove walls on both sides of the annular cutting groove, and the hot melt adhesive flows onto the inorganic layer 14 of the back plate assembly which can delay or avoid the inorganic layer 14 from creating cracks.

In this exemplary implementation, the hot melt adhesive may use EVA (ethylene-vinyl acetate copolymer) resin, which softens at about 80° C. The hot melted adhesive layer 3 is formed by coating a molten hot melt adhesive and then curing the cut sheets. Of course, the hot melt adhesives may also be polyurethane, polyamide, polyester, and the like.

Figure 5:
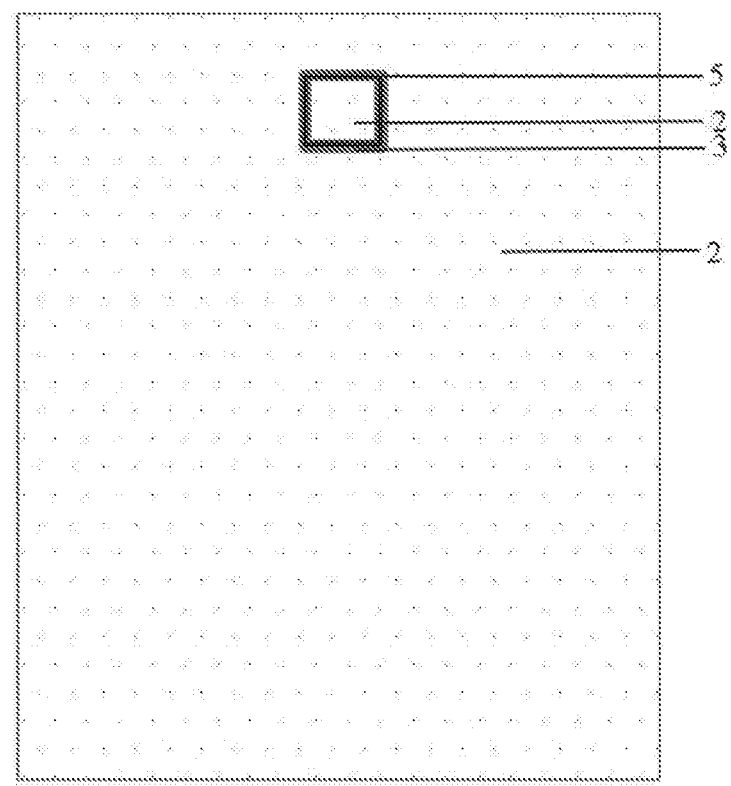
FIG. 5 is a schematic structural view of another implementation of the hot melted adhesive layer formed in the display area in FIG. 3.

Referring to FIG. 5, a schematic structural view of one implementation of the hot melted adhesive layer 3 formed in the display area of FIG. 3 is shown. The hot melted adhesive layer 3 is configured as a square ring. The outer edge of the square ring of the hot melted adhesive layer 3 protrudes outward to the outer edge of the square ring of the laser cutting area 5. The inner edge of the square ring of the hot melted adhesive layer 3 may be equal to the inner edge of the square ring of the laser cutting area 5. The hot melted adhesive layer 3 is melted by the laser cutting to cover the edge of the mouth of the annular cutting groove away from the center, and the hot melt adhesive flows into the annular cutting groove and extends to cover the outer groove wall of the annular cutting groove. Since the cross-section of the annular cutting groove is a square frame, which is surrounded by one larger square and a smaller square, the outer groove wall here refers to the side wall formed by the larger square, and the outer edge refers to the edge formed by outer groove wall extending to the mouth of the groove. Of course, the side wall formed by the relatively smaller square is the inner groove wall.

In this exemplary implementation, the "inner" refers to the side near the center of the annular cutting groove, and the "outer" is the side away from the center of the annular cutting groove.

In addition, the inner edge of the square ring of the hot melted adhesive layer 3 may be smaller than or larger than the inner edge of the square ring of the laser cutting area 5 as long as the inner edge of the square ring of the hot melted adhesive layer 3 is positioned within the outer edge of the square ring of the laser cutting area 5. The portion of the emitting layer 2 surrounded by the annular cutting groove, that is, the drilling area Z, will fall off after the secondary laser cutting to form a hole. Therefore, the inner groove wall and the inner edge of the annular cutting groove may not be covered by the hot melted adhesive layer 3.

Figure 6:
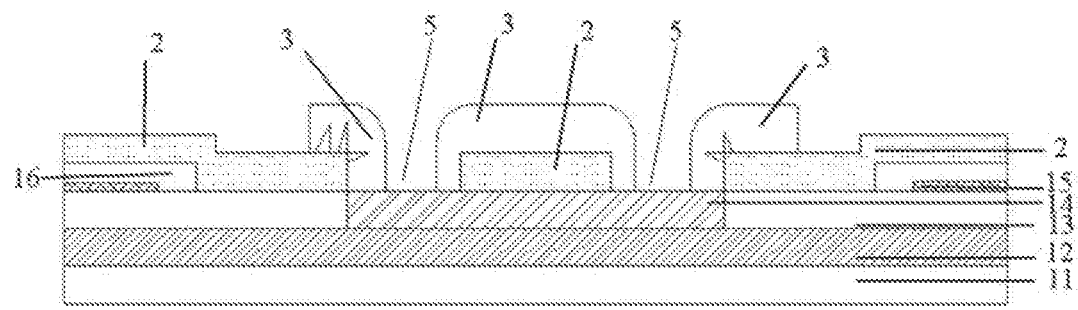
FIG. 6 is a schematic structural view of the formed hot melted adhesive layer.

In this exemplary implementation, the hot melted adhesive layer 3 includes Sift nanoparticles, that is, the $SiO_2$ nanoparticles are added into the EVA resin. Referring to FIG. 6 that is the schematic structural view of the formed hot melted adhesive layer 3, during the first laser cutting, since the region affected by heat is large, the hot melted adhesive layer 3 rapidly melts and flows into the annular cutting groove to cover the surface of the annular cutting groove. The hot melted adhesive layer 3, due to having Sift of great density, preferentially flows into the annular cutting groove, and Sift can reflect infrared light, absorb heat, accelerate a cooling rate of the hot melt adhesive to protect the inner emitting layer 2 of the annular cutting groove, and reduce the effect of heat to diffuse to the display area. The adhesive layer having low density in the hot melted adhesive layer 3 covers the metal burrs to improve surface roughness. The $SiO_2$ nanoparticles in the hot melted adhesive layer 3 may also be replaced by other inorganic particles having a greater density than the resin.

Figure 7:
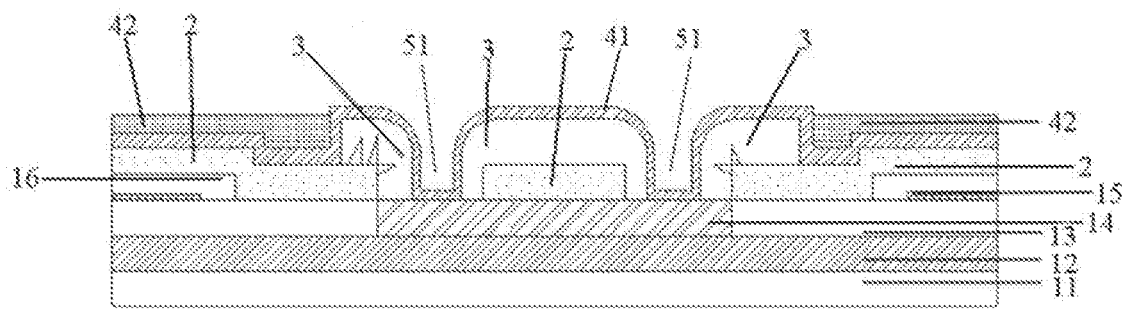
FIG. 7 is a schematic structural view of a first inorganic layer and an organic packaging layer formed on the basis of FIG. 6.

Referring to FIG. 7, a schematic structural view of a first inorganic layer and an organic packaging layer formed on the basis of FIG. 6 is shown. The packaging layer includes a first inorganic layer 41, an organic packaging layer 42, and a second inorganic layer 43. The first inorganic layer 41 is disposed on the back plate assembly, the hot melted adhesive layer 3, and the emitting layer 2, wherein a receiving groove 51 is formed on the first inorganic layer 41 covering the groove wall of the annular cutting groove. Since the height of the hot melted adhesive layer 3 is higher, the height of the hot melted adhesive layer 3 covered by the first melt layer 41 is higher than the height of the first inorganic layer 41 at the emitting layer 2, which provides a level ground (坪坝) in which the organic packaging layer 42 is formed in the next step. The organic packaging layer 42 is provided on the first inorganic layer 41, and interrupted on the hot melted adhesive layer 3, that is, there is no organic packaging layer 42 disposed in the area surrounded by the hot melted adhesive layer 3 and the hot melted adhesive layer 3. The first inorganic layer 41 is in close contact with the organic layer 14 of the back plate assembly to ensure the water-oxygen isolation capacity of the edge. The first inorganic layer 41 may include a combination of one or more of a silicon oxide, a silicon nitride, and an aluminum oxide, and may also be SiNO, which is formed by PECVD (Plasma Enhanced Chemical Vapor Deposition). The packaging layer of the organic layer is formed by curing using a polyacrylate.

The second inorganic layer 43 is disposed on the organic packaging layer 42 and the first inorganic layer 41. The second inorganic layer 43 and the first inorganic layer 41 package the organic packaging layer 42 to ensure the water-oxygen isolation capacity. A cutting space 52 is formed on the second inorganic layer 43 covering the groove wall of the receiving groove 51. The cutting space 52 provides sufficient space for subsequently laser cutting back plate assembly. The edges formed by the first inorganic layer 41 and the second inorganic layer 43 after the secondary laser cutting are substantially integrally formed so that closure is achieved, and the edges formed by the first inorganic layer 41 and the inorganic layer 14 of the back plate assembly after the secondary laser cutting are substantially integrally formed so that closure is achieved, to further improve the packaging effect. The second inorganic layer 43 may include a combination of one or more of the silicon oxide, the silicon nitride, and the aluminum oxide, and may be formed by a plasma enhanced chemical vapor deposition (PECVD) and an atomic layer deposition (ALD), or the like.

Figure 8:
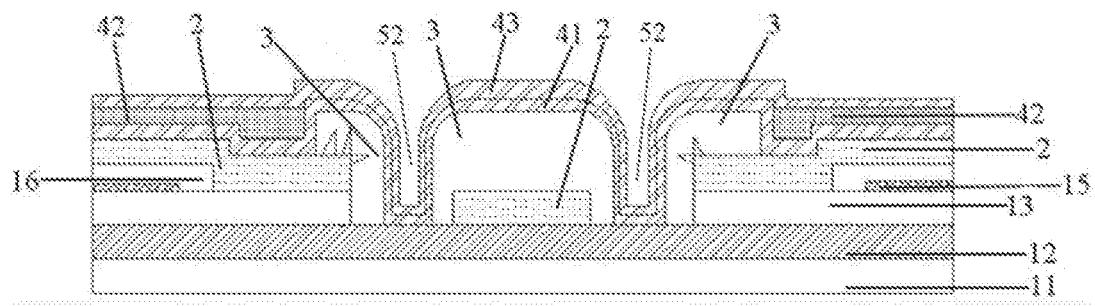
FIG. 8 is a schematic structural view of another implementation of the display area drilling and packaging structure of the present disclosure.

Referring to FIG. 8, a schematic structural view of another implementation of the display area drilling and packaging structure is shown. This exemplary implementation differs from the implementation as shown in FIG. 1 mainly in that an inorganic layer 14 is not disposed in the via hole H1 disposed on the flat layer 13. The emitting layer 2 is formed on the pixel definition layer 16, the flat layer 13, and the intermediate layer 12. By packaging as mentioned above, closure of the first organic layer 14 and the intermediate layer 12 is formed, which may ensure a better package of the edges.

Figure 9:
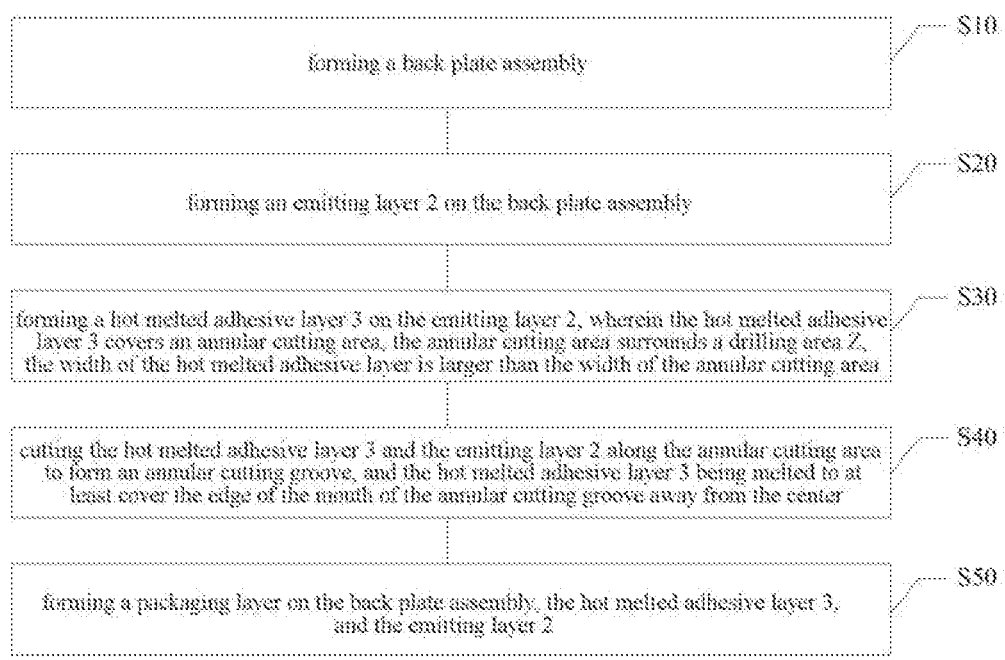
FIG. 9 is a schematic flow chart of a method for drilling and packaging in the display area of the present disclosure.

The present disclosure also provides a display area drilling and packaging method corresponding to the aforesaid display area drilling and packaging structure. Referring to the flow chart of the display area drilling and packaging method as shown in FIG. 9, the display area drilling and packaging method may include following steps:

step S10, forming a back plate assembly;

step S20, forming an emitting layer 2 on the back plate assembly;

step S30, forming a hot melted adhesive layer 3 on the emitting layer 2, wherein the hot melted adhesive layer 3 covers an annular cutting area, the annular cutting area surrounds a drilling area Z, and the width of the hot melted adhesive layer is larger than the width of the annular cutting area;

step S40, cutting the hot melted adhesive layer 3 and the emitting layer 2 along the annular cutting area to form an annular cutting groove, and the hot melted adhesive layer 3 being melted to at least cover the edge of the mouth of the annular cutting groove away from the center;

step S50, forming a packaging layer on the back plate assembly, the hot melted adhesive layer 3, and the emitting layer 2.

In this exemplary implementation, the hot melted adhesive layer 3 may include $SiO_2$ electrodeless nanoparticles.

In this exemplary implementation, a method of forming a packaging layer on the back plate assembly, the hot melted adhesive layer 3, and the emitting layer 2 may include: forming a first inorganic layer 41 on the back plate assembly, the hot melted adhesive layer 3, and the emitting layer 2; forming an organic packaging layer 42 on the first inorganic layer 41, wherein the organic packaging layer 42 forms an interruption in a region surrounded by the hot melted adhesive layer 3 and the hot melted adhesive layer 3; and forming a second inorganic layer 43 on the organic packaging layer 42 and the first inorganic layer 41, wherein a cutting space 52 is formed on the second inorganic layer 43 covering the groove wall of the annular cutting groove.

In this exemplary implementation, a method of forming a back plate assembly may include providing a flexible substrate 11. An intermediate layer 12 is formed on the flexible substrate 11. A flat layer 13 is formed on the intermediate layer 12. Also, a via hole H1 is formed in the drilling area Z of the flat layer 13. The area of the via hole H1 is larger than the area of the drilling area Z.

In this exemplary implementation, the method of forming the back plate assembly may further include forming an organic layer 14 in the via hole H1.

In the exemplary implementation, the method of forming the back plate assembly may further include: forming an anode layer 15 on the flat layer 13, and forming a first through hole H2 on the anode layer 15, the area of the first through hole H2 is larger than the area of the drilling area Z. A pixel definition layer 16 is formed on the anode layer 15, and a second through hole H3 is formed on the pixel definition layer 16, and the area of the second through hole H3 is larger than the area of the drilling area Z.

In this exemplary implementation, the hot melted adhesive layer is configured in a ring shape, and has an outer edge projecting outwardly from an outer edge of the annular cutting area and an inner edge equal to or smaller than an inner edge of the annular cutting area.

In this exemplary implementation, the hot melted adhesive layer is configured in a square sheet shape, and has an outer edge projecting outwardly to the outer edge of the annular cutting area.

The display area drilling and packaging method has been explained in detail in the corresponding display area drilling and packaging structure, and therefore will not be described repeatedly herein.

Further, the present disclosure also provides a display device, which may include the display area drilling and packaging structure. The specific structure of the display area drilling and packaging structure has been described in detail, and thereby will not be described repeatedly herein.

According to the display area drilling and packaging structure and the display device of the present disclosure, a hot melted adhesive layer covers the edge of the mouth of the annular cutting groove away from the center, and a packaging layer is formed on the back plate assembly, the hot melted adhesive layer, and the emitting layer. On one hand, the metal burr generated by cutting may be covered by the hot melted adhesive layer, after cooling, the surface of the annular cutting groove can be optimized and flattened; on the other hand, the packaging layer performs a further package to ensure the packaging effect of the edge of the annular cutting groove.

According to the display area drilling and packaging method of the present disclosure, the hot melted adhesive layer is formed on the emitting layer, the hot melted adhesive layer at least covers the annular cutting area, and the hot melted adhesive layer and the emitting layer are cut along the annular cutting area to form the annular cutting groove, the hot melted adhesive layer at least cover the edge of the mouth of the annular cutting groove away from the center; and the packaging layer is formed on the back plate assembly, the hot melted adhesive layer, and the emitting layer. In one aspect, during the laser cutting, the hot melted adhesive layer rapidly melts to cover the edge of the mouth of the annular cutting groove away from the center so as to cover the metal burr produced by cutting, and to absorb heat to protect the emitting layer. In another aspect, the hot melted adhesive layer after cooling can optimize and flatten the surface of the annular cutting groove. In another aspect, the hot melted adhesive can delay development of the cracks on the back plate assembly. In a further aspect, further packaging is performed by the packaging layer to ensure the packaging effect of the edge of the annular cutting groove.

The foresaid features, structures, or characteristics may be combined in one or more embodiments in any suitable manner, if possible, the characteristics as discussed in each of the embodiments may be interchangeable. Numerous specific details as above described are provided for fully understanding the embodiments of the present disclosure. However, it will be acknowledged for the person skilled in the art that the technical solutions of the present disclosure practiced without one or more of the specific details, or by using other methods, components, materials, etc. may be employed. In other instances, well-known structures, materials, or operations are not shown or described in detail to avoid obscuring various aspects of the present disclosure.

The relativity words, such as "upper" or "lower", as used herein, are directed to describe the relative relationship of the referenced component to another component. These words are used herein for convenience only, for example, according to the direction of the illustrative examples as shown in the figures. It should be appreciated that if the referenced device is inversed upside down, the component indicated as being the "upper" side would become the component on the "lower" side. When one structure is "on" another structure, it is possible to indicate that the one structure is integrally formed on the other structure, or the one structure is "directly" arranged on the other structure, or one structure is "indirectly" formed on the other structure by means of a further structure.

The terms "a", "an", "the", "said" and "at least one", when describing element/constituent/or the like as described and/or shown herein, are used to express the presence of one or more the element/constitute/or the like. The terms "include", "comprise" and "have", as used herein, are intended to be inclusive, and mean there may be additional elements/constituents/or the like other than the listed elements/constituents/or the like. In addition, the words "first", "second", or the like, as used in claims, are meant to indication, but not to limit the object to which they modify.

It should be understood that this disclosure would never be limited to the detailed construction and arrangement of components as set forth in this specification. This disclosure has other embodiments that can be practiced or carried out in various ways. The foregoing variations and modifications fall within the scope of this disclosure. It should be understood that this disclosure may contain all alternative combination of two or more individual features as mentioned or distinct from in the text and/or in the drawings. All of these different combinations constitute a number of alternative aspects of this disclosure. The embodiments as illustrated in this specification are the best modes known to achieve this disclosure and will enable one skilled in the art to realize this disclosure.

What is claimed is:

1. A system, comprising:
   a display area drilling and packaging structure, comprising:
      a back plate assembly;
      an emitting layer disposed on the back plate assembly having a drilling area;
      an annular cutting groove disposed on the emitting layer, the annular cutting groove surrounding the drilling area;
      a hot melted adhesive layer covering at least an edge of a mouth of the annular cutting groove away from a center, wherein the hot melted adhesive layer comprises a resin, the resin comprising inorganic particles therein having a density greater than the resin; and
      a packaging layer disposed on the back plate assembly, the hot melted adhesive layer, and the emitting layer.

2. The system according to claim 1, wherein the resin is an EVA resin, and the inorganic particles are $SiO_2$ nanoparticles.

3. The system according to claim 2, further comprising a display device, the display device comprising the display area drilling and packaging structure.

4. The system according to claim 1, wherein the packaging layer comprises: a first inorganic layer disposed on the back plate assembly, the hot melted adhesive layer, and the emitting layer, wherein a receiving groove is formed on the first inorganic layer covering a groove wall of the annular cutting groove.

5. The system according to claim 4, further comprising a display device, the display device comprising the display area drilling and packaging structure.

6. The system according to claim 1, wherein the back plate assembly comprises:
   a flexible substrate;
   an intermediate layer disposed on the flexible substrate; and
   a flat layer disposed on the intermediate layer in which the flat layer is provided with a via hole at a position facing the drilling area, and wherein an area of the via hole is larger than an area of the drilling area.

7. The system according to claim 6, wherein the back plate assembly further comprises: an inorganic layer disposed in the via hole.

8. The system according to claim 6, wherein the back plate assembly further comprises: an anode layer disposed on the flat layer, wherein the anode layer is provided with a first through hole, and wherein an area of the first through hole is larger than the area of the drilling area.

9. The system according to claim 8, wherein the back plate assembly further comprises: a pixel definition layer disposed on the anode layer, in which the pixel definition layer is provided with a second through hole, and an area of the second through hole is larger than the area of the drilling area.

10. The system according to claim 1, further comprising a display device, the display device comprising the display area drilling and packaging structure.

11. The system according to claim 1, wherein the packaging layer further comprises: a second inorganic layer disposed on the organic packaging layer and the first inorganic layer, wherein a cutting space is formed on the second inorganic layer covering the groove wall of the receiving groove.

12. A system, comprising:
   a display area drilling and packaging structure, comprising:
      a back plate assembly;
      an emitting layer disposed on the back plate assembly having a drilling area;
      an annular cutting groove disposed on the emitting layer, wherein the annular cutting groove surrounds the drilling area;
      a hot melted adhesive layer covering at least an edge of a mouth of the annular cutting groove away from a center; and a packaging layer disposed on the back plate assembly, the hot melted adhesive layer, and the emitting layer, wherein the packaging layer comprises a first inorganic layer disposed on the back plate assembly, the hot melted adhesive layer, and the emitting layer, the first inorganic layer comprising a receiving groove covering a groove wall of the annular cutting groove;

wherein the packaging layer further comprises an organic packaging layer disposed on the first inorganic layer that forms interruptions on the hot melted adhesive layer and on a region surrounded by the hot melted adhesive layer.

13. The system according to claim 12, wherein the packaging layer further comprises: a second inorganic layer disposed on the organic packaging layer and the first inorganic layer, wherein a cutting space is formed on the second inorganic layer covering the groove wall of the receiving groove.

14. The system according to claim 12, wherein the hot melted adhesive layer comprises a resin and inorganic particles therein, the inorganic particles having a density greater than the resin.

15. The system according to claim 14, wherein the resin is an EVA resin, and the inorganic particles are SiO2 nanoparticles.

16. A display area drilling and packaging method, comprising:

forming a back plate assembly;

forming an emitting layer on the back plate assembly, the emitting layer having a drilling area and an annular cutting area surrounding the drilling area;

forming a hot melted adhesive layer on the emitting layer, the hot melted adhesive layer covering the annular cutting area, a width of the hot melted adhesive layer being greater than a width of the annular cutting area, wherein the hot melted adhesive layer comprises a resin and inorganic nanoparticles added into the resin, the inorganic nanoparticles having a density greater than the resin;

cutting the hot melted adhesive layer and the emitting layer along the annular cutting area to form an annular cutting groove in which the hot melted adhesive layer melts at least covers an edge of a mouth of the annular cutting groove away from the center; and forming a packaging layer on the back plate assembly, the hot melted adhesive layer, and the emitting layer.

17. The display area drilling and packaging method according to claim 16, wherein the resin is an EVA resin, and the inorganic particles are $SiO_2$ nanoparticles.

18. The display area drilling and packaging method according to claim 16, wherein the hot melted adhesive layer is provided in a ring shape, and has an outer edge protruding to an outer edge of the annular cutting area.

19. The display area drilling and packaging method according to claim 18, wherein an inner edge of the hot melted adhesive layer is equal to or smaller than an inner edge of the annular cutting area.

20. The display area drilling and packaging method according to claim 16, wherein the hot melted adhesive layer is configured in a square sheet shape, and has an outer edge protruding to an outer edge of the annular cutting area.

* * * * *